United States Patent [19]

Vette

[11] 4,216,424

[45] Aug. 5, 1980

[54] METHOD AND APPARATUS FOR TESTING ELECTROLYTIC CAPACITORS

[76] Inventor: Carl W. Vette, 1417 N. Selfridge, Clawson, Mich. 48017

[21] Appl. No.: 955,989

[22] Filed: Oct. 30, 1978

[51] Int. Cl.² .................. G01R 27/02; G01R 27/26
[52] U.S. Cl. .................................. 324/62; 324/60 C
[58] Field of Search .............. 324/60 C, 29.5, 60 R, 324/62

[56] References Cited

PUBLICATIONS

Willihnganz, E.; "A Bridge For Measuring . . . ", The Electrochemical Society, Preprint 79-20, Apr. 1941, pp. 255-256.

Primary Examiner—Ernest F. Karlsen
Attorney, Agent, or Firm—Cullen, Sloman, Cantor, Grauer, Scott & Rutherford

[57] ABSTRACT

An Equivalent Series Resistance (ESR) measurement device for testing electrolytic capacitors without removing the test capacitor from the circuit in which it is being used and without first discharging the test capacitor prior to testing. A low voltage AC ohmmeter, which operates at a frequency of approximately 100 KHz, is used as the measurement device for the in-circuit testing of the ESR and thus as an indication of the status or usability of the electrolytic capacitor being tested. A current-blocking capacitor is placed in series with the electrolytic capacitor being tested to allow in-circuit testing without damaging the meter since it blocks any DC charge remaining on the test capacitor. A pair of oppositely poled diodes are coupled in parallel across the terminals of the meter to protect the meter from surge currents and the like and a resistor is coupled in parallel with the test capacitor to provide a discharge path for discharging the series blocking capacitor when the electrolytic capacitor is removed from testing. The ESR meter itself is designed with two operational amplifiers forming an oscillator whose output is relatively immune from fluctuations in supply voltage. An amplifier network including three operational amplifiers is provided to amplify the ESR signal to a usable level. A peak-to-peak detector circuit is used which employs an operational amplifier having a supplemental feedback resistor which reduces the phase shift at the output of the operational amplifier to enable the peak detector diodes to perform their conventional functions. The two outputs of the peak detector are connected to two DC amplifiers and a conventional meter movement is driven differentially by the DC amplifiers to provide a visual readout of the measured ESR of the test capacitor for evaluation purposes and the like.

7 Claims, 6 Drawing Figures

METHOD AND APPARATUS FOR TESTING ELECTROLYTIC CAPACITORS

BACKGROUND OF THE INVENTION

The present invention relates generally to electrical test instruments, and more particularly to a method and apparatus for testing capacitors (particularly electrolytic capacitors) by measuring their ESR (Equivalent Series Resistance) in-circuit, i.e., without removing the test capacitor from its circuit and without first discharging the capacitor prior to testing.

Recent research experience on field failures of electrolytic capacitors has proven that almost all of them (approximately 99 percent) failed because of ESR (Equivalent Series Resistance). The internal resistance reduces the capacitor's rate of charging and discharging, effectively making it an open circuit. High ESR usually results from dehydration of the electrolyte in the capacitor due to equipment heat, old age, poor sealing, or internal heat generated from ESR and high ripple currents.

Another common reason for high ESR is defective terminations due to broken welds, loose crimps, or rivets and/or corrosion. These problems cause variable ESR or intermittent opens and can usually be detected by monitoring ESR while wiggling the test capacitor. This inventor has yet to find an electrolytic capacitor with normal ESR readings whose circuit failure was due to a change in capacitance alone. This is why the capacitance or capacity meters of the prior art have failed to solve the problem and are seldom, if ever, used outside of schools, engineering laboratories or the like. The real problem, unrecognized by the service industry in general for over 50 years, is not the change in the capacitance of an electrolytic capacitor, but rather ESR changes!

Only about one percent of all of today's electrolytic capacitor failures are due to leaky or shorted capacitors and both of these types of failures are easily spotted since they cause serious circuit voltage changes and often result in burned parts, or the like. The other 99 percent of all failures can only be detected in the field with some type of ESR meter or by substitution.

Conventional test devices include capacitance or capacity meters which are of little or no value, especially in the field, where less than one percent of all failures can be detected with them, as previously described. These meters are quite complex and expensive and find little or no use in the real world of installation, maintenance or repair of electrical circuits in the field.

AC volt meters can be used to measure circuit performance and detect problems but will not permit the service man to determine the exact location of the problem nor tell him, in all cases, whether or not a particular electrolytic capacitor has failed or is about to. DC ohmmeters can't be used at all to measure the resistance of capacitors since a capacitor does not pass DC current.

Recently a large corporation and major supplier for the electronics service industry came out with a capacitor analyzer which (1) measured the capacity of a capacitor after it had been removed from its circuit and discharged and (2) evaluated the general performance of electrolytic capacitors by placing the out-of-circuit, discharged, electrolytic capacitor to be tested in a simulated test circuit and evaluating it based on (a) its measured capacitance, (b) its leakage current; and (c) its out-of-the-circuit, fully discharged Equivalent Series Resistance. However, this analyzer did not succeed in the field due to (1) the need for first discharging the capacitor; (2) the need for physically removing the test capacitor from the circuit in which it is used for testing; and (3) its extreme electrical complexity and cost. Therefore, it found no use in the service industry, and is no longer even offered for sale in the market place.

A more recent attempt has resulted in a complex digital tester for laboratory use in measuring many different capacitor conditions including the out-of-circuit ESR of a capacitor, but the digital tester is extremely large, complex and costly and therefore will never find general acceptance for use in the field.

Capacitor testing today is usually done in the field (1) by paralleling a suspected bad capacitor with a known good one or (2) by substituting a good one in place of the suspected capacitor and seeing if the basic circuit performs as required. Such methods are very time consuming, costly and unreliable and often lead to blown out semiconductor components elsewhere in the circuit, as known in the art.

One of the most basic of all of the problems of the prior art lay in the fact that the prior art completely failed to recognize the usefulness of ESR in testing capacitors. For example, the prior art taught away from the use of ESR as an efficient method of testing electrolytic capacitors because the prior art specifically emphasized tht ESR is not a "pure" resistance in that it is somewhat affected frequency and is related to capacitance and hence design, and therefore, no one thought it could be measured accurately enough to be useful on a service basis for anything, let alone as a basis for testing capacitors. Besides, the fact that the failure of electrolytic capacitors was not recognized as being chiefly due to dehydration of the enclosed electrolyte or other failures causing a high ESR, was not recognized nor exploited prior to Applicant's invention.

For these reasons, while electrolytic capacitors have been used extensively for over 50 years, no one has heretofore developed a practical and reliable method and apparatus for testing capacitors in the field during installation, maintenance or other service-type operations. Applicant has filled this long-felt need by going against the teachings of the prior art, and solving substantially all of the problems of the prior art with the present method and apparatus for testing electrolytic capacitors in-circuit by measuring their ESR as an indicia of the reliability of the capacitor without first discharging the test capacitor and without removing the test capacitor from the circuit in which it is being used prior to testing.

SUMMARY OF THE INVENTION

In the preferred embodiment of the present invention, an apparatus for testing electrolytic capacitors without first discharging the test capacitor and without removing the capacitor from the circuit prior to test includes an AC ohmmeter means for measuring the ESR of the test capacitor and a blocking capacitor operatively coupled in series between the ohmmeter and the capacitor being tested for blocking any DC current resulting from the charge stored on the test capacitor.

In the preferred embodiment, the apparatus may also include a pair of oppositely poled diodes connected in parallel with one another across the terminals of the ohmmeter to protect the ohmmeter from surge currents often produced when the electrolytic capacitor is first placed under test. Additionally, a resistor may be operatively coupled across the test capacitor to provide a discharge path for discharging the blocking capacitor when the electrolytic capacitor is removed from testing.

Furthermore, in the preferred embodiment of the present invention, the AC ohmmeter is modified to include an oscillator circuit means for generating a relatively stable and reliable output signal having an operating frequency which is sufficiently high to make the capacitive reactance $X_c$ of the test capacitor negligible. The AC ohmmeter may also be modified to include a modified peak-to-peak detection circuit and plural amplifier stages to ensure that the peak-to-peak detector circuit and each stage of the amplifier is operated in a class A mode to avoid cutoff or saturation which could result in slowing the speed of response of the circuit. The peak-to-peak detector may further be modified by placing a supplemental feedback resistor between the operational amplifier output and its inverting input to supply sufficient negative feedback to increase the high frequency bandwidth of the amplifier while simultaneously reducing the phase shift at the output of the amplifier at the operating frequency to a sufficient degree so as to enable the peak detector diodes to operate in the conventional manner.

The method of the present invention includes generating an AC test signal having a predetermined frequency, operatively coupling the AC test signal to one plate of the capacitor to be tested, coupling a blocking capacitor in the series path supplying said AC test signal to said test capacitor (or in the return path or in both paths) for blocking DC current and enabling the method to be used for in-circuit testing, reading a voltage response signal indicative of the actual measured ESR in said test capacitor in response to said AC test signal and generating a visual indication thereof as a representation of the status of said tested capacitor.

Additionally, the method of the present invention may include the steps of protecting the meter circuitry by operatively coupling a pair of oppositely poled diodes in parallel with one another and with said AC test signal to prevent damage from surge currents and the like and the step of discharging the blocking capacitor through a resistor operatively coupled in parallel across said test capacitor when said test capacitor is removed from testing.

These and other advantages and meritorious features of the present invention will be more fully understood from the following detailed description of the drawings and the preferred embodiment, the appended claims and the drawings, which are briefly described herein below.

DESCRIPTION OF THE PREFERRED EMBODIMENT

Figure 1:
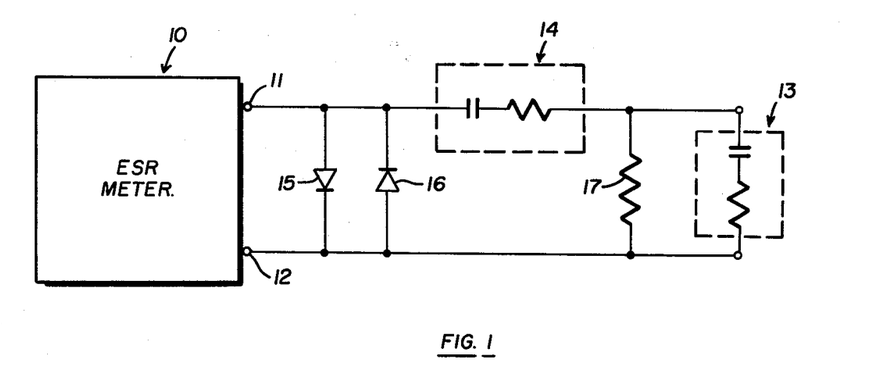
FIG. 1 is a block diagram of the ESR meter of the present invention together with a schematic diagram of the added protective circuitry required for testing of the electrolytic capacitor under test without first discharging the capacitor and without removing the capacitor from its circuit prior to testing.

FIG. 1 illustrates the preferred embodiment of the present invention and includes an ESR (Equivalent Series Resistance) meter 10 having a meter output terminal 11 and a meter input terminal 12. A series path is established between the output terminal 11 of the ESR meter 10 and the input terminal 12 through an electrolytic capacitor to be tested, represented by the capacitor and resistance located within the dotted block 13 and referred to hereinafter as the test capacitor, whose ESR is to be measured as an indication of its reliability, i.e., to detect failures and the like.

A blocking capacitor, represented by the dotted block 14 as including a capacitor and resistor in series, is inserted or placed in a series path between the meter output terminal 11 and one plate of the test capacitor 13 to block out or stop any steady-state DC current such as might result from any charge stored on the electrolytic test capacitor 13 or the like. Alternatively, the blocking capacitor 14 could be inserted in the series path between the meter input terminal 12 and the opposite plate of the test capacitor 13 or a blocking capacitor 14 could be provided in both series paths. In the preferred embodiment of the present invention, a blocking capacitor 14 is non-electrolytic and has its value selected so that its capacitive reactance $X_c$ and its ESR are extremely small at the normal operating frequency of the ESR meter 10 and can be, for all practical purposes, zeroed out or considered negligible at the operating frequency of the meter 10. Furthermore, the blocking capacitor 14 is preferably selected so as to have a DC breakdown voltage of at least 600 volts, the maximum rated voltage of today's electrolytic capacitors.

A pair of oppositely-poled first and second diodes 15 and 16, respectively, are connected in parallel across the output meter terminal 11 and the input meter terminal 12 for protecting the meter 10 against current surges and the like such as may result when the electrolytic test capacitor 13 is initially placed under test. In the preferred embodiment, the oppositely-poled diodes 15, 16 are connected in parallel across the meter terminals 11, 12 between the meter 10 and the blocking capacitor 14 as shown in FIG. 1.

Additionally, a discharge resistor 17 may be operatively coupled across the electrolytic capacitor 13 being tested to provide a discharge path for the blocking capacitor 14 when the test capacitor 13 is removed from testing. In the preferred embodiment, the discharge resistor is connected to the test capacitor 13 as shown in FIG. 1.

The oppositely-poled diodes 15 and 16 protect the ESR meter 10 from transient charging current flowing from the test capacitor 13 to the blocking capacitor 14 when the test capacitor 13 is initially placed under test, and from spurious voltage spikes and the like, since the diodes 15, 16 serve to limit the voltage applied to the ESR meter between the output meter terminal 11 and the input meter terminal 12 to the forward voltage drop of the diodes 15, 16 which is about one volt. The circuit of FIG. 1 can, therefore, be used to test electrolytic capacitors or the like for failures by measuring the equivalent series resistance thereof and a testing can be done in the field but without the electrolytic capacitor 13 being initally discharged and without it being physically removed from the circuit in which it is being utilized prior to testing. The in-circuit testing of the electrolytic capacitor 13 is made feasible by the use of the blocking capacitor 14 and the other protective features described herein; by the use of a 25 mv rms AC test signal which will not turn on active semiconductor devices; by the fact that typical circuit resistances are much higher than ESR; and the like.

Figure 2:
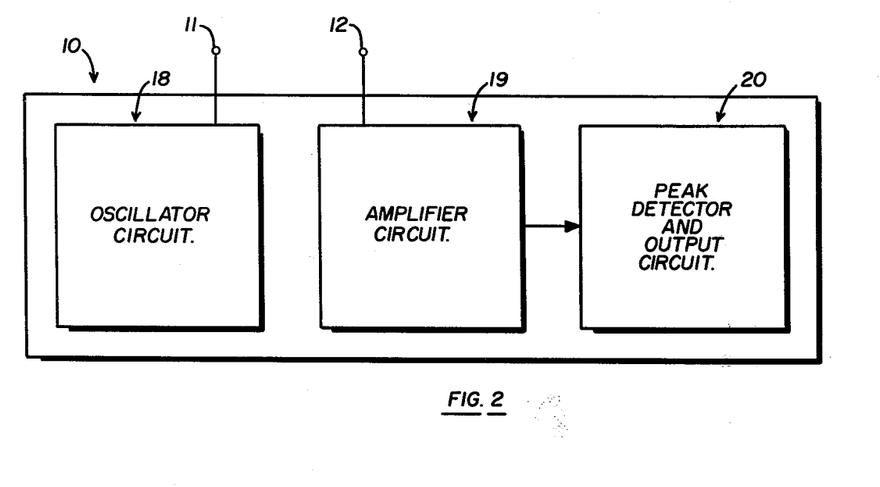
FIG. 2 is a more detailed block diagram showing the three separate stages of the ESR meter of FIG. 1.

The ESR meter of block 10 may be, for example, a modified low voltage AC ohmmeter which can be represented functionally by the more detailed blocks of FIG. 2. FIG. 2 shows the ESR meter 10 as including an oscillator circuit, represented by block 18; an amplifier circuit, represented by block 19; and a peak detector and output circuit, represented generally by block 20.

The oscillator circuit of block 18 is shown as having an oscillator output lead corresponding to the ESR meter output terminal 11 of FIG. 1 which is used to supply an AC test signal to the test capacitor 13 and it also includes an input lead, corresponding generally to the meter input terminal 12 of FIG. 1 for supplying a voltage response signal indicative of the actually measured ESR of the test capacitor 13 in response to the application of the AC test signal supplied thereto. Briefly, the oscillator circuit of block 18 is a regenerative oscillator circuit havig sufficient gain to establish and maintain a reliable AC test signal having a predetermined frequency and magnitude which is relatively insensitive to fluctuations in supply voltage and the like. In the preferred embodiment of the present invention, the oscillator circuit of block 18 generates an AC test signal at a frequency of 100 KHz and a magnitude of approximately 25 mV (millivolts) rms.

The amplifier circuitry of block 19 employs a plurality of operational amplifier gain stages each stabilized by negative feedback to overcome production variations and the like for amplifying the small voltage response signal appearing across a relatively small load resistor and indicative of the actual measured ESR of the test capacitor 13 to obtain usable results and insure that the peak-to-peak detector of block 20 and the various amplifier stages are operated in the class A mode to avoid cut-off or saturation which would tend to slow the response speed of the circuit, as known in the art.

The peak detector and output circuitry of block 20 includes a peak-to-peak detector operated in a class A mode for detecting the positive and negative peak values of the sine wave input signal and the two outputs of the peak-to-peak detector drive DC operational amplifiers which in turn are used to differentially drive a conventional meter movement for providing a visual indication of the measured ESR of the capacitor 13, as known in the art.

The ESR meter of FIG. 2 uses eight conventional integrated circuit operational amplifiers. An operational amplifier has a very high gain for example, 100,000 or more, and has an inverting and a non-inverting input. The non-inverting input has an in-phase relationship with the operational amplifier output and the inverting input has an out-of-phase relationship with the operational amplifier output. Operational amplifiers used with negative feedback, produced by connecting the output of the operational amplifier back to the inverting input to establish a fixed amount of gain per stage, to broaden the operational amplifier's frequency response, to increase the input impedance of the amplifier, and to decrease the output impedance of the amplifier. Normally, an operational amplifier reaches a stable operating condition when the signals at its inputs are equal. If the positive or non-inverting input is driven positive by an input signal, the output will go positive and drive the negative input or inverting input to an equal level through external feedback resistors, as known in the art.

Figure 3:
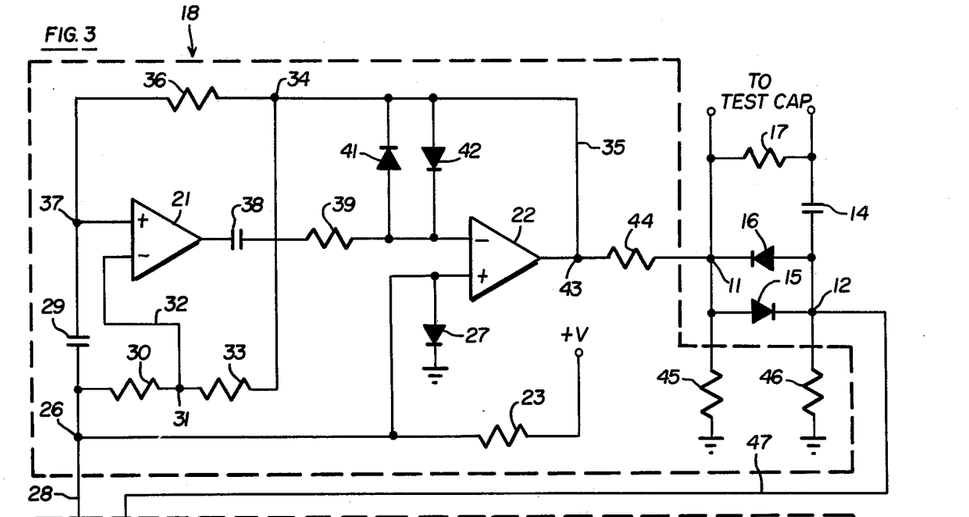
FIG. 3 is a detailed circuit diagram of the oscillator circuitry of block 18 of the ESR meter of FIG. 2.

FIG. 3 illustrates the electrical circuit diagram of the preferred embodiment of the oscillator portion of the ESR meter 10 represented by block 18 of FIG. 2. Operational amplifiers 21 and 22 form a regenerative oscillator circuit having an operating frequency, in the preferred embodiment of the present invention, of 100 KHz. The use of two operational amplifiers 21, 22 provides additional gain at the operating frequency in order to establish a more reliable, production-reproducible circuit that is relatively insensitive to fluctuations in battery supply voltage and the like. A positive source of supply voltage+V (for example +3 volts obtained from two ordinary "C"-type cells) is supplied to operational amplifiers 21, 22, 51, and 52 via the +V terminal 24 of operational amplifier 52 since these four amplifiers are in a single package and share a common +V input. The negative supply voltage inputs of these amplifiers are connected to ground via the −V terminal 25. Similarly, the supply voltages for the four commonly packaged operational amplifiers 53, 72, 82 and 91 are supplied by the +V and −V terminals 24', 25' of operational amplifier 53. The +V supply voltage is also connected through a resistor 23 to a voltage reference node 26. Node 26 is connected to ground through a forward-biased diode 27 which has its anode connected directly to node 26 and its cathode connected directly to ground thereby establishing a voltage reference point at about 0.5 volts and is also connected directly to the non-inverting input of operational amplifier 22.

Figure 4:
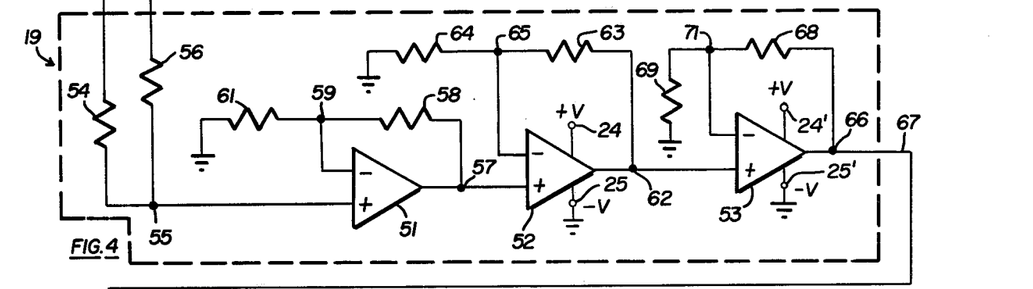
FIG. 4 is a detailed circuit diagram of the amplifier circuitry of block 19 of the ESR meter of FIG. 2.

Node 26 is connected via lead 28 to the amplifier circuit of block 19 of FIG. 4; is connected to one plate of a basic timing capacitor 29; and is connected to one terminal of a resistor 30 whose opposite terminal is connected to a voltage divider node 31.

Voltage divider node 31 is connected via lead 32 directly to the negative or inverting input of operational amplifier 21 and to one terminal of a second voltage divider feedback resistor 33 whose opposite terminal is connected via node 34 and lead 35 to the output of operational amplifier 22. Node 34 is also connected to one terminal of a resistor 36 whose opposite terminal is connected to the opposite plate of the basic timing capacitor 29 at the positive or non-inverting input node 37 of the operational amplifier 21.

The output of operational amplifier 21 is connected to one plate of a capacitor 38 whose opposite plate is connected to one input of a resistor 39 whose opposite input is connected to the inverting or negative input of the operational amplifier 22. The inverting input of amplifier 22 is also connected to its output lead 35 through a pair of parallel connected, oppositely-poled diodes 41 and 42. Diode 41 has its anode connected directly to the inverting input of operational amplifier 22 and its cathode connected to lead 35 whereas diode 42 has its anode directly connected to lead 35 and its cathode connected directly to the inverting input of operational amplifier 22.

The output of operational amplifier 22 is taken from output node 43 which is fed back via lead 35 and is also connected to one terminal of a resistor 44 whose opposite terminal represents the meter output terminal 11, as previously described with respect to FIGS. 1 and 2. A meter output terminal or node 11 is connected to one terminal of a ten ohm source resistor 45 whose opposite terminal is connected to ground and which is used to supply the 25 mV AC test signal to the electrolytic capacitor 13 to be tested via the circuitry previously described with respect to FIG. 1.

In the circuit of FIG. 3, the blocking capacitor 14 is inserted in the return path from the electrolytic capacitor 13 under test rather than in the supply path as illustrated in FIG. 1, and the response signal from the tested capacitor is represented by the voltage drop across a ten ohm load resistor 46 which has one end connected to the meter input node or terminal 12 and its opposite end connected directly to ground. The voltage dropped across the load resistor 46 is supplied from the meter input 12 to the amplifier circuitry of block 19 via lead 47, as hereinafter described.

Briefly, the capacitor 29 serves as the basic timing capacitor for the oscillator comprising operational amplifiers 21 and 22 and the diodes 41 and 42 serve to clip the bottom and top of the generated sine wave so that the output level and frequency of the circuit of FIG. 3 is relatively immune to fluctuations in supply voltage and the like. In the preferred embodiment, the operating frequency is selected to be 100 KHz and the oscillator output at node 11 is used to drive the ten ohm source resistance 45 to provide an AC test signal having an rms magnitude of approximately 25 mV for testing the sample or test capacitor 13 as previously described. The response of the test capacitor 13 to the AC test signal is reflected as a voltage across the ten ohm load resistor 46 and the level of voltage dropped across resistor 46 and appearing at node 12 is indicative of the actual measured ESR value of the test capacitor 13 since the capacitive reactance $X_c$ is considered to be negligible at the operating frequency selected. The values of the source resistor 45 and load resistor 46 are used to determine meter scaling, as conventionally known.

As previously indicated, the blocking capacitor 14 is placed in the series path between the ESR meter 10 and the test capacitor 13 in either the supply path or the return path for blocking any DC voltage that may be present due to a charge existing on the test capacitor or the like. In the preferred embodiment of the present invention, the blocking capacitor 14 is non-electrolytic and has an extremely low value of capacitive reactance $X_c$ and ESR at the operating frequency of the system so as to be considered negligible for present measurement purposes.

Similarly, the oppositely-poled diodes 15, 16 connected across the terminals 11, 12 of the meter 10 are used to protect the ESR meter 10 from any transient charging current flowing from the test capacitor 13 to the blocking capacitor 14 at the moment of test and serve to limit the voltage applied to the ESR meter to the forward voltage drop across the diodes 15, 16 and therefore about one volt or less. As previously described, resistor 17 provides a path for discharging the blocking capacitor 14 upon removal of the test capacitor 13 from testing.

The 100 KHz oscillator circuit of FIG. 3 operates as follows. When the power supply +V is initially turned on, the positive or non-inverting terminal of the operational amplifier 22 goes to approximately 0.5 volt (the drop across the voltage reference diode 27). Since the inverting input of operational amplifier 22 is initially lower than 0.5 volts, the output rises to one volt (the sum of the voltage across the reference diode 27 and the diode 42), and this one volt pulse is applied to the non-inverting input of the first operational amplifier 21 and is also used to begin charging the basic timing capacitor 29.

The inverting input of the first operational amplifier 21 receives a voltage which is part way between the 0.5 volt reference and the one volt pulse and the non-inverting input of operational amplifier 21 is temporarily held at zero by the action of the timing capacitor 29. Since the voltage at the non-inverting input of operational amplifier 21 is initially smaller than the voltage appearing at the inverting input, the output of operational amplifier 21 goes negative, to zero. This is a stable operating condition and remains so until the charge on the timing capacitor 29 builds up to one volt. At this point, the voltage at the non-inverting input of operational amplifier 21 becomes more positive than the voltage appearing at the inverting input so that the output of the operational amplifier 21 is caused to rise to a level of approximately one volt.

The positive one volt pulse at the output of operational amplifier 21 is capacitively coupled through capacitor 38 and resistor 39 to the inverting input of the second operational amplifier 22. Since the inverting input of the second operational amplifier is now more positive than the non-inverting input, the output of operational amplifier 22 goes negative, to zero.

The low signal at the output of operational amplifier 22 now begins discharging the basic timing capacitor 29 through the resistor 36 until the voltage at the non-inverting input of the first operational amplifier 21 again becomes lower than the value of the voltage at the inverting input at node 31. When the output of the first operational amplifier 21 again goes low, putting the inverting input of the second operational amplifier 22 in the original oscillator condition, the entire cycle repeats itself to produce a highly accurate and stable AC output signal at an operating frequency of 100 KHz.

The amplifier circuitry of block 19 of FIG. 2 will now be described with reference to the detailed circuit diagram of FIG. 4. The circuitry of FIG. 4 includes three operational amplifiers 51, 52 and 53 which amplify the small response voltage appearing across the ten ohm load resistor 46 at the input node 12 by a factor of approximately 20. Each stage of the amplifier has a gain of about 2.8 since the ratio of the output voltage to the feedback voltage at the inverting input, which is determined by the output voltage divider networks, establishes such values. The low gain figure is due to the fact that operational amplifiers do not have a gain of much more than 10 at an operating frequency such as 100 KHz and hence the gain per stage must be stabilized by negative feedback to overcome production variations and the like.

DC bias lead 28 is outputted from the oscillator circuit of block 18 of FIG. 3 and is connected to one terminal of a bias resistor 54 whose opposite terminal is connected to a node 55. The signal indicative of measured ESR which is developed across the load resistor 46 is supplied from the ESR meter input node 12 via lead 47 to one terminal of a resistor 56 whose opposite terminal is also connected directly to node 55. Node 55 is in turn connected directly to the positive or non-inverting input of the first stage operational amplifier 51. The output of the first operational amplifier 51 is supplied to output node 57 which supplies the amplified output of operational amplifier 51 directly to the non-inverting or positive input of the second stage operational amplifier 52 and to one terminal of a feedback resistor 58 whose opposite terminal is connected to a voltage divider feedback node 59. Node 59 is connected directly to the inverting input of the operational amplifier 51 and to one terminal of a second voltage divider resistor 61 whose opposite terminal is connected to ground. The value at the voltage divider node 59 is determined by the values of the resistors 58 and 61 and the value of the output signal from the first stage operational amplifier 51 and provides the negative feedback required for amplification and stabilization purposes, as known in the art.

The operational amplifier 52 has its output connected directly to a second operational amplifier output node 62 which is connected directly to the positive or non-inverting input to the third and final operational amplifier input stage 53 of the circuit of block 19. Node 62 is also connected for negative feedback via a voltage divider configuration including voltage divider resistors 63 and 64 and voltage divider output node 65. The amplifier output node 62 is connected to one terminal of a voltage divider feedback resistor 63 whose opposite terminal is connected to the voltage divider output node 65. The voltage divider output node 65 is connected to one terminal of the second voltage divider resistor 64 whose opposite terminal is grounded. The output from the voltage divider node 65 is connected directly to the negative or inverting input of the second stage operational amplifier 52 to provide the negative feedback required for amplification and stabilization purposes as previously described.

Lastly, the output of operational amplifier 53 is taken from the third and final operational amplifier output node 66 which supplies the properly amplified signal indicative of the measured ESR reading to the peak-to-peak detector circuitry of block 20 as hereinafter described via lead 67. Node 66 is also connected to provide negative feedback via a voltage divider comprising resistors 68 and 69 and a voltage divider output node 71. The operational amplifier output node 66 is connected to one terminal of a first voltage divider feedback resistor 68 whose opposite terminal is connected directly to the voltage divider output node 71 while node 71 is connected to one terminal of the second voltage divider resistor 69 whose opposite terminal is grounded. The voltage divider output node 71 is connected directly to the negative or inverting input of operational amplifier 53 to provide the required negative feedback for amplification and stability purposes, as known in the art.

Figure 5:
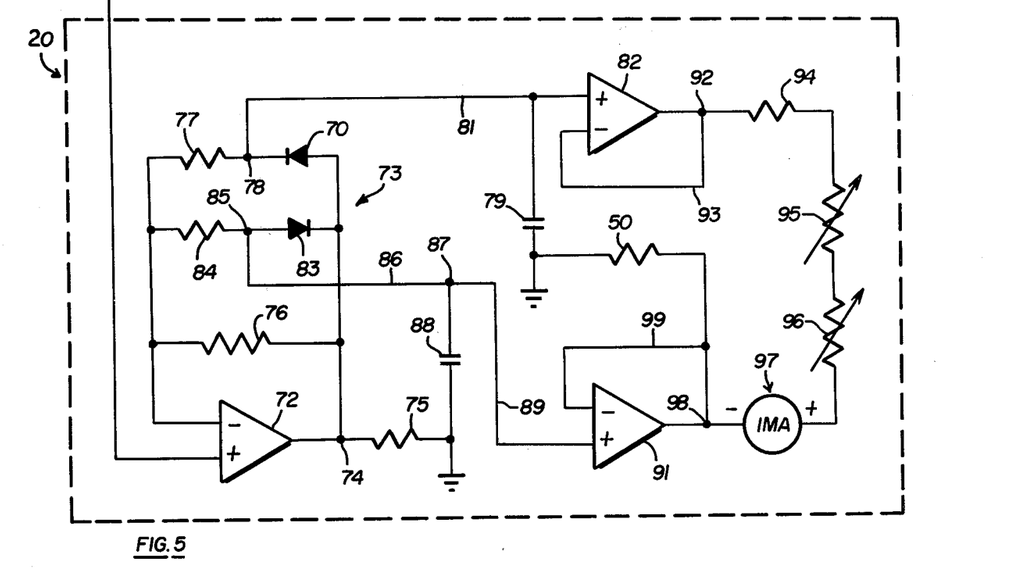
FIG. 5 is a detailed circuit diagram of the peak detector and output circuitry of the block 20 of the ESR meter of FIG. 2 of the preferred embodiment of the present invention.

In operation, the small DC operating bias voltage established across resistors 54 and 56 is amplified by all three stages so that the individual operational amplifier stages 51, 52 and 53 and the peak-to-peak detector circuitry of FIG. 5 are operated in the class A mode. The output of the amplifier circuitry of block 19 is supplied via lead 67 to the positive or non-inverting input of the operational amplifier 72 of the peak-to-peak detector 73 of FIG. 5. The output of the operational amplifier 72 is connected directly to operational amplifier output node 74. Node 74 is connected to one terminal of a pull-down resistor 75 whose opposite terminal is connected directly to ground and is also connected through a supplemental negative feedback resistor 76 back to the negative or inverting input of the operational amplifier 72 for providing a large amount of negative feedback around the operational amplifier 72 to increase the high frequency bandwidth of the amplifier and, most importantly, to reduce the phase shift at the output of the operational amplifier 72 to a value of ten degrees or less so as to enable the peak detector diodes, as hereinafter described, to operate in the conventional manner for a peak-to-peak detector.

The output node 74 is also connected back to the inverting input of amplifier 72 by a positive peak detecting diode circuit comprising the series combination of a diode 70 and a resistor 77. The anode of the positive peak-detecting diode 70 is connected directly to the output node 74 while the cathode is connected directly to a peak-to-peak detector output node 78. Output node 78 is connected to one terminal of the resistor 77 whose opposite terminal is then connected directly to the inverting input of the operational amplifier 72. Whenever the incoming sine wave signal goes positive, the output of the operational amplifier 72 will also go positive. But, it must go positive enough to overcome the voltage drop across the positive peak-detecting diode 70 before sufficient positive voltage can be fed back to the inverting input of the amplifier 72 so as to stabilize the operation of the amplifier. The voltage fed back by supplemental feedback resistor 76 is not in itself sufficient to stabilize the amplifier because part of its feedback signal voltage is shunted to ground by resistor 84 in series with capacitor 88 and also by resistor 77 in series with capacitor 79.

During this period, the capacitor 79 charges up via lead 81 which is connected to the positive peak detecting output node 78 and to one plate of the capacitor 79 and simultaneously to the positive or non-inverting input of a DC amplifier 82 having a gain of one. When the capacitor 79 charges up to the peak value of the sine wave, the voltage across the capacitor 79 becomes representative of the incoming sine wave peak and the voltage drop across the diode 76 then becomes inconsequential. A similar action transpires during the negative peak detection cycle, as known in the art.

A negative peak-detecting circuit comprising the series combination of a diode 83 and a resistor 84 is also connected across the operational amplifier 72 between the output node 74 and the inverting input and in parallel with the negative feedback resistor 76 and the positive peak-detecting series circuit previously described. One terminal of resistor 84 is connected directly to the negative or inverting input of operational amplifier 72 while the opposite terminal is connected directly to the negative peak-detecting output node 85. Node 85 is connected directly to the anode of a diode 83 whose cathode is connected directly to the operational amplifier output node 74 to complete the peak detector feedback configuration.

The negative peak-detecting output node 85 is also connected via lead 86 to a node 87. Node 87 is connected to one plate of a capacitor 88 whose opposite plate is connected directly to ground and node 87 is also connected via lead 89 directly to the positive or non-inverting input of a second DC amplifier 91 having a gain of one and the operation of the negative peak detecting circuit comprising the diode 83 and resistor 84 together with the operation of the amplifier 72 and capacitor 88 operates as described above with respect to the positive peak detecting circuit operation, as known in the art.

The peak-to-peak detector 73 is operated in a class A mode to avoid cut-off or saturation which could slow its speed of response and the negative feedback resistor 76 becomes extremely important since it provides sufficient negative feedback to increase the high frequency bandwidth of the amplifier and, much more importantly, to reduce the phase shift at the output 74 of the operational amplifier 72 to enable the feedback operation of the peak detector diodes 76, 83 to function in the conventional manner for a peak-to-peak detector. Without the negative feedback resistor 76, the phase shift of the operational amplifier 72 is approximately 90 degrees at the operating frequency of 100 KHz and the resulting feedback through the diodes 76, 83 becomes completely ineffectual. Although the resistor 76 can be functionally replaced by a suitable capacitor, such as a 350 picofarad capacitor, its value becomes very critical since the capacitor's impedance and phase shift are also frequency dependent, as known in the art.

The output of the first DC amplifier 82 is taken from DC amplifier output node 92 which is connected via lead 93 directly back to the negative or inverting input of amplifier 82 and is also connected through a resistor 94 to one terminal of a first variable resistor 95 whose opposite terminal is connected to the first terminal of the second variable resistor 96 whose opposite terminal is then connected to the positive input of a conventional one milliamp meter movement 97 whose negative input is connected directly to the output node 98 of the second DC amplifier 91 previously described.

The DC amplifier output node 98 is connected back to the negative or inverting input of the DC amplifier via lead 99 and is also connected to one input of a pull-down resistor 50 whose opposite terminal is connected to ground.

The one milliamp meter movement is driven differentially by the DC amplifiers 82 and 91 to provide a visual indication of the measured ESR of the electrolytic capacitor 13 tested and therefore a representation of the usability of the tested capacitor. The first variable resistor 95 is an internal coarse-zero adjustment potentiometer or the like while the second variable resistor 96 may be a front-panel full-scale zero adjustment means permitting manual adjustments to insure accurate meter readings, as known in the art.

Figure 6:
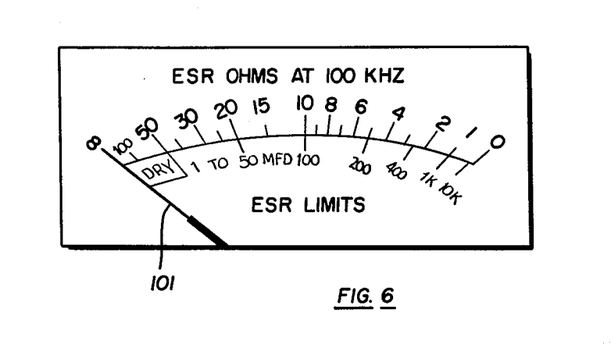
FIG. 6 is a front view of the meter readout including two scales and a single indicator means.

The visual meter readout of the preferred embodiment of the present invention is illustrated in FIG. 6. Two scales disposed one above the other are displayed on a single dial face, the upper scale being calibrated in ohms and the lower scale being calibrated in microfarads.

Based on manufacturer's data, circuit theory, experience and experimental research, it has been established that for capacitors over 50 microfarads, the relationship between the two scales should be selected such that the value of the measured ESR in ohms times the value of the capacitance in microfarads equals 1000.

$$C \times R = 1000$$
$$\text{(mfd)} \quad \text{(ohms)} \quad \text{(max)}$$

Readings between 20 and 50 ohms are permitted for 1 to 50 mfd capacitances in medium or high impedance circuits and any reading over 50 ohms indicates that the test capacitor should be replaced (labeled "DRY" in FIG. 6).

The meter movement which is differentially driven by the DC amplifiers 82 and 91 positions the indicator means or pointer 101 to visually display the ESR reading and/or capacitor status on the dual scale dial face of FIG. 6.

The method and apparatus of the present invention has been successfully used to test electrolyte capacitors having values of from one to ten thousand microfarads in-circuit. The method and apparatus of the present invention shows up intermittent openings and provides a measure of the dryness of the electrolyte in the capacitor. Although the measured ESR, being electrochemical in nature, is influenced by temperature, by testing in the 65° to 85° F. range (room temperature), corrections for temperature are normally unnecessary especially since we are testing for relatively large ESR changes of ten to one hundred times normal.

In most cases, the user does not need to know the capacitors value because the ESR value will either be very high, indicating an unusable or faulty electrolytic capacitor or very low, indicating a good electrolytic capacitor. The DC voltage rating of the capacitors does not matter since ESR is independent of the DC voltage rating of the capacitor. To be extra safe, it is recommended that the electrolytic capacitors be tested with the power off. This also avoids current surges that may temporarily "heal" bad connections in the electrolytic capacitor under test and the system of the present invention avoids "blown" semiconductors which often result from surge currents when paralleling live capacitors.

With this detailed description of the specific apparatus used to illustrate the preferred embodiment of the present invention and the operation thereof, it will be obvious to those skilled in the art that various modifications can be made in the present method and apparatus and in the specific circuit configuration described herein without departing from the spirit and scope of the invention which is limited only by the appended claims.

I claim:

1. Apparatus for testing electrolytic capacitors in-circuit and without first discharging the capacitor to be tested by measuring the ESR (equivalent series resistance) of the electrolytic test capacitor comprising:

oscillator circuit means for generating a relatively stable test output signal having an operating frequency sufficiently high to make the capacitive reactance $X_c$ of the test capacitor negligible;

source resistor means operatively coupled to the output of said oscillator circuit means for reducing the magnitude of the test output signal to the millivolt range so that the signal value is not sufficiently high to turn on semiconductor components in the circuit whose electrolytic capacitor is being tested;

a non-electrolytic blocking capacitor operatively coupled in series between said source resistor means and one plate of the test capacitor for blocking all steady state DC current to enable in-circuit testing, the value of said blocking capacitor being selected so as to have a low capacitive reactance $X_c$ at said operating frequency and a negligible ESR;

load resistor means operatively coupled to the opposite plate of said test capacitor for producing a voltage signal indicative of the actual measured ESR of the electrolytic capacitor being tested;

first and second oppositely poled protective diodes operatively coupled between said source resistor means and said load resistor means for protecting the apparatus from transient charging currents flowing from the electrolytic capacitor being tested to the blocking capacitor whenever the test capacitor is first placed under test thereby limiting the return voltage to about one volt;

a discharge resistor operatively coupled in parallel across said electrolytic capacitor being tested to complete a discharge path for discharging the blocking capacitor when the electrolytic capacitor is removed from test;

amplifier means for receiving said voltage signal indicative of the measured ESR of the electrolytic capacitor being tested from said load resistor means and amplifying said voltage across said load resistor means to attain a usable level;

peak-to-peak detector means responsive to the usable level of amplified voltage signal from said amplifier means for detecting the positive and negative peaks thereof while avoiding cut-off and saturation in order to increase the response time of the circuit;

meter means for measuring the ESR of said electrolytic capacitor under test and providing an accurate visual indication thereof; and DC amplifier means responsive to the outputs of said peak-to-peak detector means for differentially driving said meter means for producing a measurement reading accurately indicative of the measured ESR of the test capacitor and representative of its usability.

2. The apparatus for testing electrolytic capacitors of claim 1 wherein said peak-to-peak detector means includes an operational amplifier having an inverting input, a non-inverting input, and an amplifier output, a series circuit comprising a first resistor connected in series with a first peak-detecting diode such that one terminal of said first resistor is connected to the inverting input of said operational amplifier while the opposite terminal is connected to the anode of said first peak-detecting diode whose cathode is connected to the output of said operational amplifier, a second series circuit comprising a second resistor and a second peak-detecting diode wherein said second resistor has one terminal connected to said inverting input and its opposite terminal connected to the cathode of said second peak-detecting diode whose anode is connected to the output of said operational amplifier, the first and second outputs of said peak-to-peak detector means being taken from the junction of said first resistor and the anode of said first peak-detecting diode, and from the junction of said second resistor and the cathode of said second peak-detecting diode, respectively, said peak-to-peak detector means further including a supplemental negative feedback resistor operatively coupled between said inverting input of said operational amplifier and said amplifier output for providing a large negative feedback for increasing the high frequency bandwidth of the amplifier while simultaneously reducing the phase shift at the output of said operational amplifier at said operating frequency to an amount which enables the feedback operation of said first and second peak-detecting diodes to be utilized in the conventional manner for a peak-to-peak detector circuit.

3. The apparatus for testing electrolytic capacitors of claim 1 wherein said peak-to-peak detector means includes an operational amplifier having an inverting input, a non-inverting input, and an amplifier output, a series circuit comprising a firt resistor connected in series with a first peak-detecting diode such that one terminal of said first resistor is connected to the inverting input of said operational amplifier while the opposite terminal is connected to the anode of said first peak-detecting diode whose cathode is connected to the output of said operational amplifier, a second series circuit comprising a second resistor and a second peak-detecting diode wherein said second resistor has one terminal connected to said inverting input and its opposite terminal connected to the cathode of said second peak-detecting diode whose anode is connected to the output of said operational amplifier, the first and second outputs of said peak-to-peak detector means being taken from the junction of said first resistor and the anode of said first peak-detecting diode and from the junction of said second resistor and the cathode of said peak-detecting diode, respectively, said peak-to-peak detector means further including a negative feedback means including a supplemental feedback capacitor operatively coupled between said inverting input and the output of said operational amplifier for reducing the phase shift at the output of said operational amplifier at said operating frequency of said oscillator circuit means to an amount which will enable the feedback operation of said first and second peak-detecting diodes to function in the conventional manner for peak detection operation.

4. Apparatus for testing electrolytic capacitors incircuit without removing the test capacitor from its circuit and without first discharging said test capacitor comprising:

AC ohmmeter means having a test output and a test input for measuring the equivalent series resistance of said test capacitor, said test capacitor being operatively coupled in a series path between said test output and said test input of said AC ohmmeter means for measuring the ESR of said electrolytic capacitor being tested;

a blocking capacitor having a low capacitive reactance $X_c$ and a relatively low ESR relative to the electrolytic capacitor under test operatively coupled in series between one input of said AC ohmmeter means and said test capacitor for blocking any steady state DC voltage to permit in-circuit testing;

said AC ohmmeter means including graduated scale means for providing a visual indication of said measured ESR; and said AC ohmmeter means further including peak detector means having an operational amplifier, a pair of oppositely poled peak detecting diodes connected between the output of said amplifier and one input thereof, and a supplemental feedback resistor coupled in parallel with said pair of diodes between the output of said amplifier and said input for providing a relatively large amount of negative feedback for reducing the phase lift at the output of said operational amplifier to a low enough level to permit the peak detector diodes to operate in a conventional peak-detecting manner.

5. The apparatus for testing electrolytic capacitors of claim 4 further including first and second oppositely-poled diode means operatively coupled between said test input and said test output of said AC ohmmeter means and in parallel with the series combination of said blocking capacitor and said electrolytic capacitor under test for protecting said AC ohmmeter means from transient surges and the like; and a resistive means operatively coupled across said electrolytic capacitor under test and in parallel therewith for providing a path for discharging said blocking capacitor when said electrolytic capacitor is removed after testing.

6. In an ESR meter for measuring the equivalent series resistance of an electrolytic capacitor and having oscillator means for producing a low voltage AC test signal whose magnitude and frequency is relatively insensitive to fluctuations in supply voltage, means for amplifying a response signal indicative of the ESR actually measured in said electrolytic capacitor under test in response to the application of said AC test signal thereto, meter means for visually displaying an indication of said measured ESR, means responsive to said amplified signal indicative of actual measured ESR for driving said meter means to produce an accurate indication of said measured ESR, the improvement comprising means for enabling said ESR meter to be used for testing an electrolytic capacitor in-circuit without removing said electrolytic capacitor to be tested from the circuit in which it is being used and without first discharging said electrolytic capacitor to be tested including:

an output test lead adapted to be operatively coupled in series between said oscillator means and one plate of said test capacitor for supplying said AC test signal to said electrolytic capacitor being tested;

an input test lead adapted to be operatively coupled in series between the opposite plate of said test capacitor for supplying a response signal indicative of the actual measured ESR of said tested electrolytic capacitor in response to the application of said AC test signal thereto and supplying same to said amplifying means for providing an ESR measurement indication on said meter means; and a non-electrolytic blocking capacitor operatively coupled in series with one of said input and output test leads between said meter means and said electrolytic capacitor to be tested for blocking any DC current due to a charge stored on said electrolytic capacitor to enable in-circuit testing;

said meter means including first and second scales on a single metal dial face, said first scale being calibrated in ohms and said second scale being calibrated in microfarads and wherein the relationship between said first and second scales in such that the arithmetic product of the first scale markings and the second scale marking at coincident points on said meter dial face equals one thousand over a substantial portion of said dial face and wherein any reading over fifty ohms on said first scale corresponds to an indicia indicating a need for replacing said test capacitor.

7. A method for testing the usability of electrolytic capacitors by checking for intermittent open circuits, dehydrated electrolytes, defective terminations, and the like, by measuring the ESR (equivalent series resistance) of the electrolytic test capacitor with a meter without removing the test capacitor from its utilization circuit and without first discharging said test capacitor comprising steps of:

(1) blocking the flow of DC current resulting from any charge stored on said electrolytic capacitor being tested by placing a blocking capacitor between said meter and the electrolytic test capacitor;

(2) generating an AC test signal having a predetermined operating frequency;

(3) applying said generated AC test signal to said electrolytic test capacitor; and (4) measuring the response voltage produced upon application of said AC test signal to said test capacitor for generating a signal indicative of the measured ESR of said electrolytic test capacitor and hence of the usability of said electrolytic test capacitor;

(5) driving a visual meter read-out with siad signal indicative of the measured ESR for test purposes; and (6) discharging said blocking capacitor thru a resistor coupled in parallel across the test capacitor when said test capacitor is removed from testing.

* * * * *